US007678595B2

(12) United States Patent
Chang

(10) Patent No.: US 7,678,595 B2
(45) Date of Patent: Mar. 16, 2010

(54) METHOD FOR FORMING A LIGHT EMITTING APPARATUS

(75) Inventor: Jung-Chien Chang, Xinzhuang (TW)

(73) Assignee: Mutual-Tek Industrial Co., Ltd., Xinzhuang (TW)

( * ) Notice: Subject to any disclaimer, the term of this patent is extended or adjusted under 35 U.S.C. 154(b) by 48 days.

(21) Appl. No.: 12/201,188

(22) Filed: Aug. 29, 2008

(65) Prior Publication Data

US 2009/0061552 A1     Mar. 5, 2009

(30) Foreign Application Priority Data

Sep. 5, 2007    (TW) .............................. 96133030 A

(51) Int. Cl.
*H01L 21/00*     (2006.01)
(52) U.S. Cl. ............................ 438/29; 438/22; 438/30; 257/E21.511

(58) Field of Classification Search ................. 438/22, 438/29–30; 257/E21.511
See application file for complete search history.

(56) References Cited

U.S. PATENT DOCUMENTS 7,344,909 B2 *   3/2008   Kroll et al. ..................... 438/57
7,456,035 B2 *   11/2008   Eliashevich et al. ........... 438/25
7,510,889 B2 *   3/2009   Pan et al. ....................... 438/26
7,621,794 B2 *   11/2009   Lee et al. ....................... 445/25

* cited by examiner

*Primary Examiner*—Thanh Nguyen
(74) *Attorney, Agent, or Firm*—Snell & Wilmer L.L.P.

(57) ABSTRACT

A light emitting apparatus includes a patterned conductive layer, a light emitting component, and a first light diffusion layer, wherein the light emitting component is disposed on the patterned conductive layer and the light emitting component and the patterned conductive layer are embedded into the first light diffusion layer. The method for manufacturing the light emitting apparatus is also disclosed.

10 Claims, 8 Drawing Sheets

METHOD FOR FORMING A LIGHT EMITTING APPARATUS

CROSS REFERENCE TO RELATED APPLICATIONS

This application claims the right of priority based on Taiwan Patent Application No. 096133030 entitled "LIGHT EMITTING APPARATUS AND METHOD FOR THE SAME," filed on Sep. 5, 2007, which is incorporated herein by reference and assigned to the assignee herein.

TECHNICAL FIELD

The present invention relates to a light emitting apparatus and more particularly, to a light emitting apparatus supported by a light diffusion layer.

BACKGROUND OF THE INVENTION

Generally in liquid crystal displays, a light emitting apparatus is incorporated therein for providing light, as the liquid crystals themselves are nonluminous. Such a light emitting apparatus is normally referred as a backlight unit. FIG. 1 illustrates a conventional backlight unit 100, which includes light sources 110; a housing 120 enclosing the light sources 110; a reflective layer 121 coated on the inner surface of the housing 120; a light diffusion plate 113 and another optic films 140 stacked above the housing 120. The backlight unit 100 is formed by initially installing the light sources 110 at predetermined positions on the inner surface of the housing 120; then disposing the light diffusion plate 130 above the light sources 110 and the housing 120; and then stacking the optic films 140 on light diffusion plate 130.

Although the aforementioned conventional backlight unit 100 can provide the liquid crystal displays with sufficient brightness, it brings obstructions when reducing the thickness of the entire liquid crystal displays is required, especially for the applications of diverse portable electronic products. The higher the thickness of the backlight unit, the more the obstructions for designers as contemplating the required lighter and smaller portable electronic products. Therefore, it is desired to provide inventive methods and structures to address the issues caused by the conventional technique.

SUMMARY OF THE INVENTION

The present invention provides a light emitting apparatus having light sources embedded in a light diffusion layer, such that the thickness of the light emitting apparatus is reduced.

One aspect of the present invention is to provide a light emitting apparatus including a patterned conductive layer, a light emitting component, and a first light diffusion layer, wherein the light emitting component is disposed on the patterned conductive layer and the light emitting component and the patterned conductive layer are embedded into the first light diffusion layer.

Another aspect of the present invention is to provide a method for manufacturing a light emitting apparatus, the method including the steps of providing a substrate; forming a patterned conductive layer on the substrate; disposing a light emitting component on the patterned conductive layer; and forming a first light diffusion layer over the substrate and allowing the light emitting component and the patterned conductive layer to be embedded in the first light diffusion layer.

BRIEF DESCRIPTION OF THE DRAWINGS

The present invention will now be described, by way of examples, with reference to the accompanying drawings, in which.

DETAILED DESCRIPTION OF THE PREFERRED EMBODIMENTS

Figure 1:
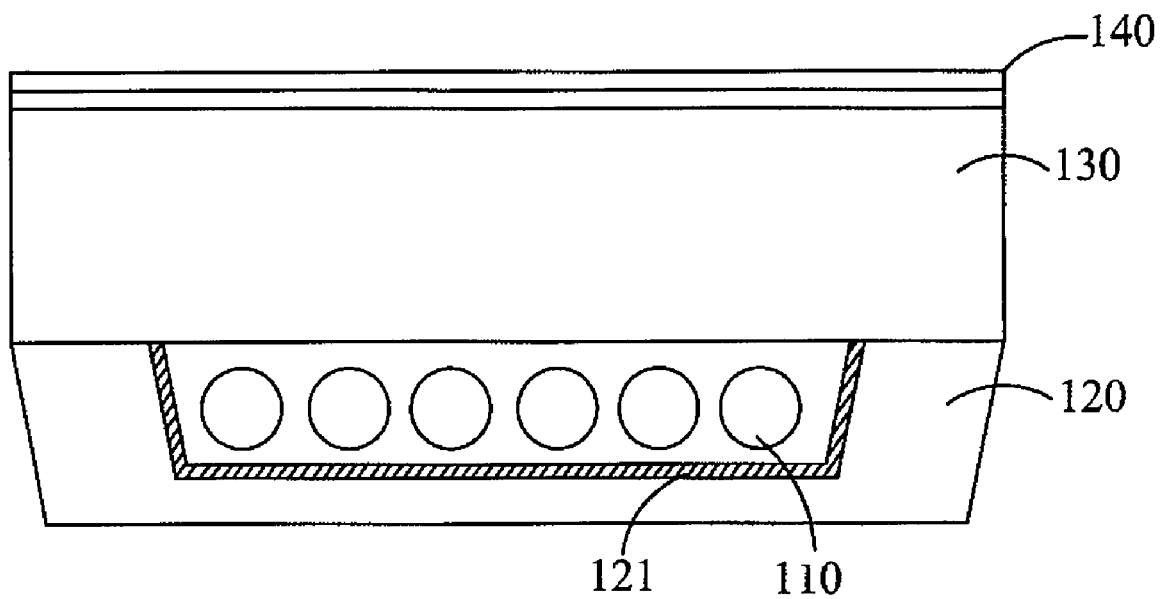
FIG. 1 illustrates a schematic section view of a conventional light emitting apparatus.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as not to unnecessarily obscure the embodiments of the invention.

FIG. 2A to FIG. 2I schematically illustrate the first embodiment of the present invention.

Figure 2A:
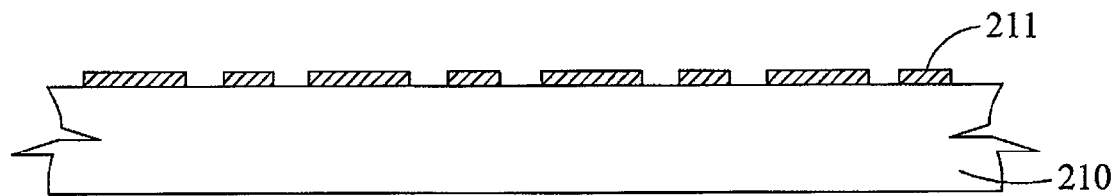
FIG. 2A to FIG. 2J illustrate schematic section views of a light emitting apparatus during manufacturing in accordance with a first embodiment of the present invention.

Referring to FIG. 2A, a substrate 210 is provided and then a patterned conductive layer 211 is formed on the substrate 210. In the first embodiment, the substrate 210 can be made of any suitable materials, preferably a steel plate or a copper plate. The thickness of the substrate is not limited. The patterned conductive layer 211 is formed by conventional techniques such as lithography, imprinting or screen-printing. In the case of lithography, a patterned photo resist (not shown) is first formed on the substrate 210; then forming the patterned conductive layer 211 on the substrate 210 by electroplating or any other suitable way utilizing the patterned photo resist as a mask; and then the patterned photo resist is removed. The patterned conductive layer 211 can be made of copper or any other suitable materials. The thickness of the first conductive substrate 211 can vary and is typically in a range between 0.2 mil and 2 mil.

Figure 2B:
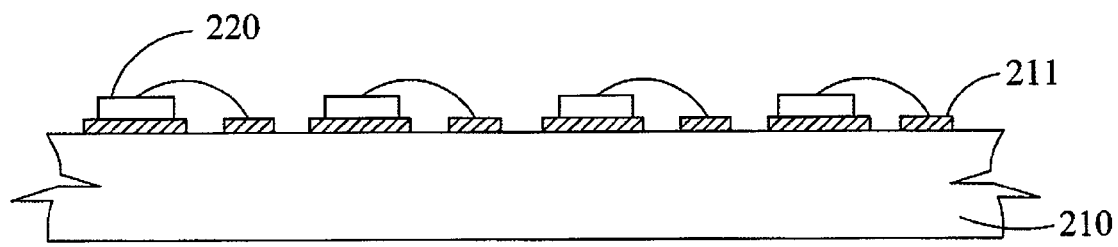

Referring to FIG. 2B, multiple light emitting components 220 are installed at predetermined positions on the patterned conductive layer 211; and the light emitting components 220 are electrically connected to the patterned conductive layer 211 by wire bonding. In the first embodiment, the light emitting component 220 can be a light emitting diode, and preferably can be a bare chip of a light emitting diode.

Figure 2C:
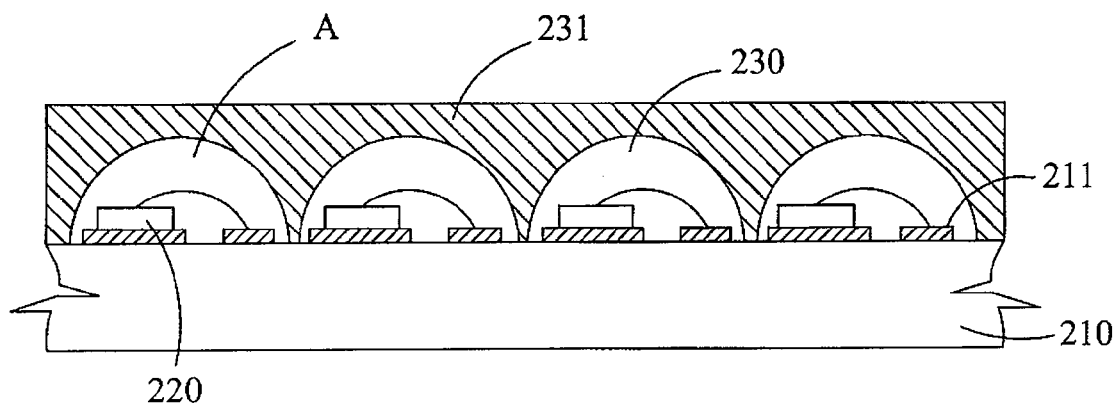
Figure 2D:
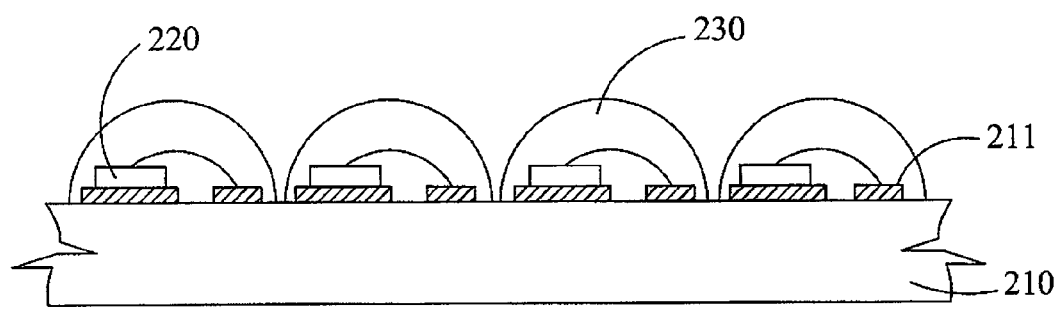

Referring to FIG. 2C to FIG. 2D, a transparent layer 230 covering the light emitting components 220 is formed. The transparent layer 230 can be lens, preferably with multiple spherical surfaces for respectively covering each light emitting component 220. The formation of the transparent layer 230 is preferably performed by providing a first injection mold 231 having cavities A as shown in FIG. 2C; disposing the resultant structure of FIG. 2B under the injection mold 231 and allowing the cavities A to accommodate the light emitting components 220; utilizing an injection molding technique to inject molding materials into the cavities A and harden the molding materials to form the transparent layer 230, wherein the light emitting components 220 are embedded within the transparent layer 230. The molding materials for the transparent layer 230 can be any suitable materials such as epoxy, silicon robber, acrylic resin, or fluoro-resin, in which the silicon robber is preferred. If desired, the other chemical components such as fluorescent powders for changing the color of the emitted light can be added in the molding materials. The outline of the transparent layer 230 is essentially defined by the first injection mold 231 having the cavities A. Therefore, the transparent layer 230 is arched as lampshades. The shape of the cavity A provided herein is for illustration rather than limitation. Note that the transparent layer 230 is preferably endurable for high temperatures to prevent damages in subsequent processes. In the first embodiment, the thickness of the transparent layer 230 is below 0.5 millimeter, preferably in a range of 0.2 to 0.4 millimeter. FIG. 2D illustrates the structure after forming the transparent layer 230 and removing the first injection mold 231.

Figure 2E:
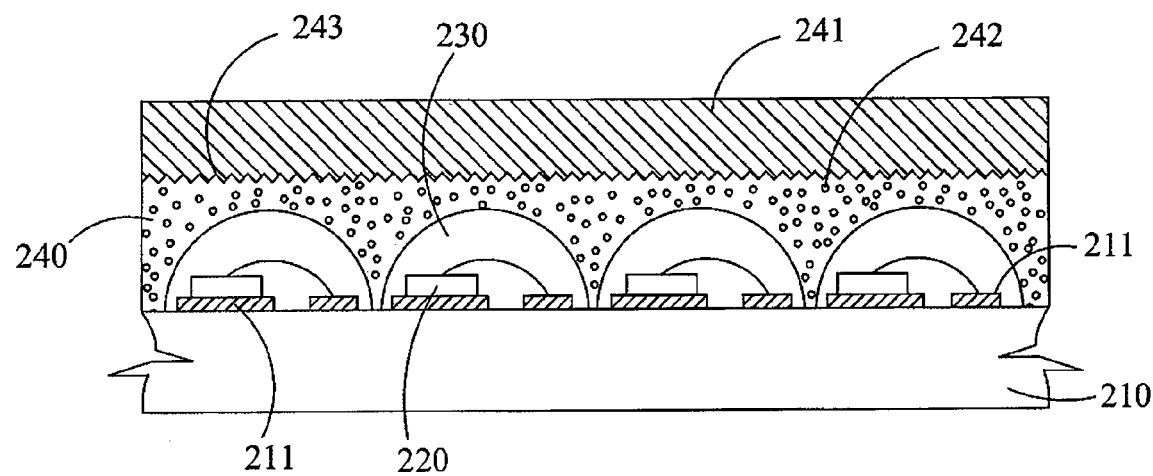
Figure 2F:
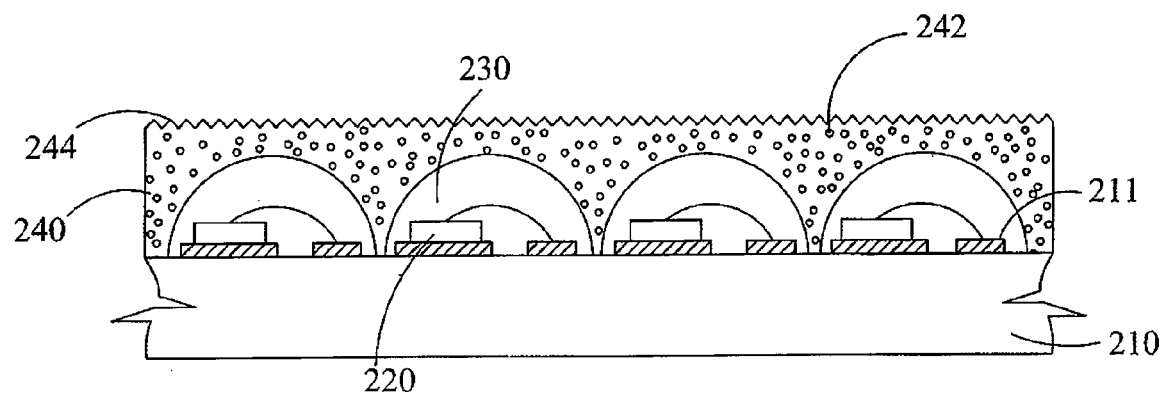

Referring to FIG. 2E and FIG. 2F, a first light diffusion layer 240 is formed over the substrate 210 and the light emitting components 220, the transparent layer 230 and the patterned conductive layer 211 are all embedded in the first light diffusion layer 240. The formation of the first light diffusion layer 240 is similar to the formation of the transparent layer 230. Specifically, the formation of the first light diffusion layer 240 is preferably performed by providing a second injection mold 241; disposing the resultant structure of FIG. 2D under the second injection mold 241 to form a space between the second injection mold 241 and the transparent layer 230; utilizing an injection molding technique to inject molding materials into the space and harden the molding materials to form the first light diffusion layer 240, wherein the light emitting components 220, the transparent layer 230 and the patterned conductive layer 211 are all embedded in the first light diffusion layer 240. The molding materials for the first light diffusion layer 240 can be any suitable materials such as polycarbonate, acrylic esters, methyl acrylate, acrylate-styrene copolymer, cyclo-olefin copolymer, polyethylene terephthalate, or polystyrene, in which the cyclo-olefin copolymer is preferred. If desired, the additives such as light diffusion particles for enhancing light diffusion effectiveness can be mixed with the molding materials. The light diffusion particles can be made of $TiO_2$, $SiO_2$, acrylic esters, polystyrene or any combinations thereof. Preferably, the amount of the light diffusion particles is around 1 wt % to 5 wt % based on the amount of the molding materials for the first light diffusion layer. FIG. 2F illustrates the structure after forming the first light diffusion layer 240 and removing the second injection mold 241. The outline of the first light diffusion layer 240 can vary depending upon the shape of the second injection mold 241. Note that the second injection mold 241 illustrated in FIG. 2E includes a rugged surface 243 thereby the first light diffusion layer 240 is formed with another rugged surface 244. The rugged surface 244 can enhance the uniformity of light diffusion and can be formed alternatively by plasma striking or printing except the aforementioned method, in which by plasma striking can be more sophisticated. Note that the formation of the rugged surface 244 is optional not necessary. In the first embodiment, the substrate 210 will be removed in the following steps and then the first light diffusion layer 240 will be the supporter of the light emitting apparatus. Therefore, the first light diffusion layer 240 must be sufficient thick and rigid to hold the patterned conductive layer 211, the light emitting components 220, the transparent layer 230 and other optic films. In the first embodiment, the thickness of the first light diffusion layer 240 is below 3 millimeter, preferably in a range of 1 to 2 millimeter.

Figure 2G:
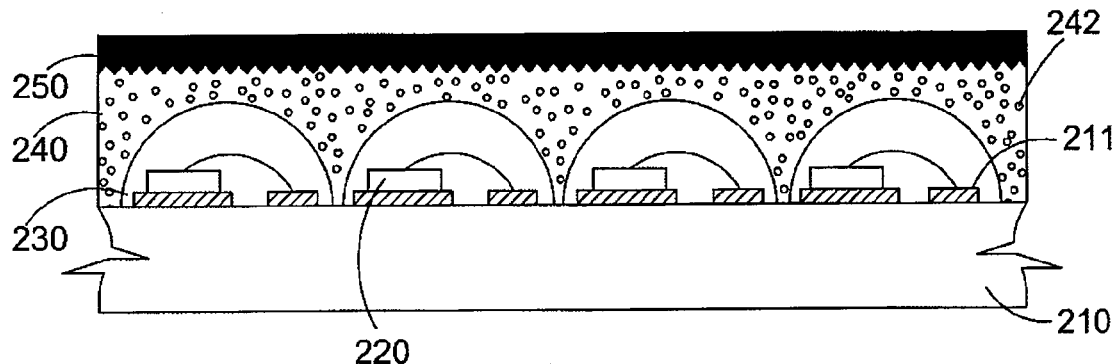

Referring to FIG. 2G, a second light diffusion layer 250 is optionally formed over the first light diffusion layer 240. In the first embodiment, the formation of the second light diffusion layer 250 is performed by depositing the aforementioned materials of the light diffusion particles 242 on the surface of the first light diffusion layer 240 utilizing physical or chemical evaporation. The second light diffusion layer 250 is not necessary if the light diffusion effectiveness is enough as the first light diffusion layer 240 is present.

Figure 2H:
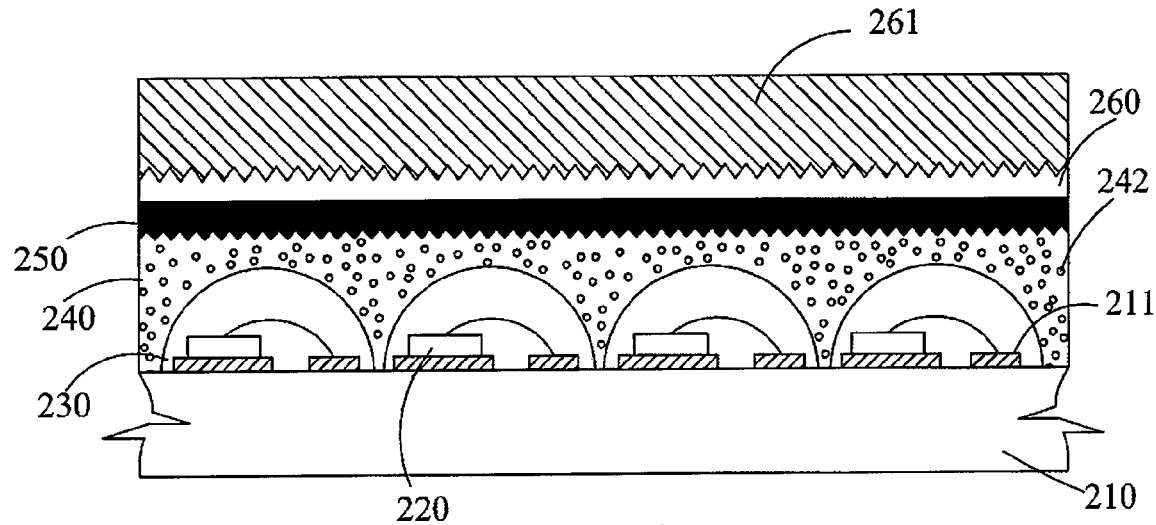
Figure 2I:
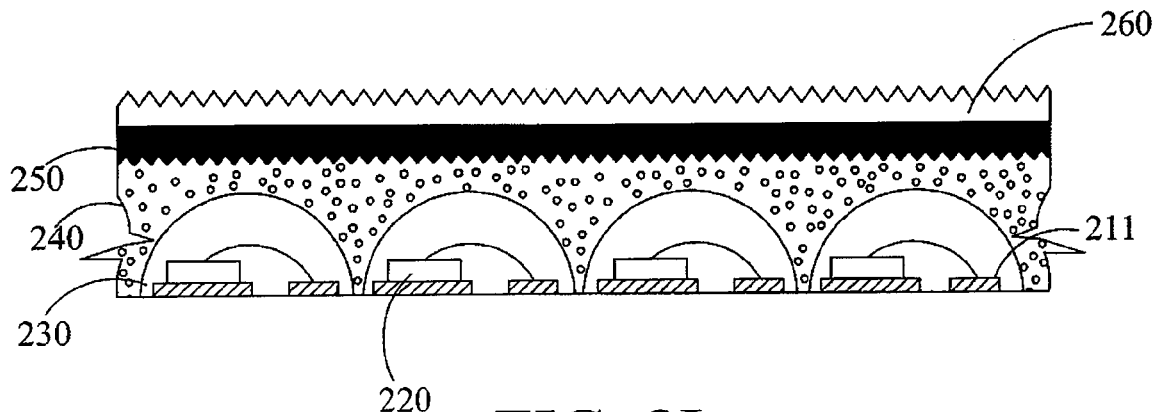

Referring to FIG. 2H and FIG. 2I, a prism layer 260 for enhancing the emission of light is formed over the substrate 210 to cover the second light diffusion layer 250 and then the substrate 210 is removed to expose the patterned conductive layer 211. Similarly, the formation of the prism layer 260 can be performed utilizing injection molding by providing a third injection mold 261; disposing the resultant structure of FIG. 2G under the third injection mold 261 to form a space between the third injection mold 261 and the second light diffusion layer 250; injecting molding materials into the space and hardening the molding materials to form the prism layer 260. The molding materials for the prism layer 260 can be any suitable materials such as polycarbonate, acrylic esters, methyl acrylate, acrylate-styrene copolymer, cyclo-olefin copolymer, polyethylene terephthalate, or polystyrene. FIG. 2I illustrates the structure after forming the prism layer 260 and removing the third injection mold 261. The outline of the third injection mold 261 can vary depending upon the shape of the third injection mold 261.

FIG. 2I illustrates the integrated structure of the patterned conductive layer 211, the light emitting components 220, the transparent layer 230, the first diffusion layer 240, the optional second diffusion layer 250 and the prism layer 260 by way of three times of the injection molding procedure. Note that in FIG. 2I, the light emitting components 220 and the patterned conductive layer 211 are embedded in the first light diffusion layer 240. Therefore, in comparison with the conventional structure of FIG. 1, the present invention has advantages in reducing the thickness of the apparatus by eliminating the conventional housing 120 for receiving the light sources 110/the light emitting components 220. Note that the first embodiment illustrates the light emitting components 220 and the patterned conductive layer 211 entirely embedded in the first light diffusion layer 240. Therefore, the bottom surface of the patterned conductive layer 211 is coplanar with the bottom surface of the first light diffusion layer 240. The present invention also includes other embodiments in which only a portion of the light emitting components 220 or a portion of the patterned conductive layer 211 is embedded in the first light diffusion layer 240. With the integrated structure of the present invention, it will be more convenient for assembling the light emitting apparatus with other parts to obtain an electronic product, such as a liquid crystal display or a mobile phone. The assembling procedure will become simpler and the productivity will be increased.

Figure 2J:
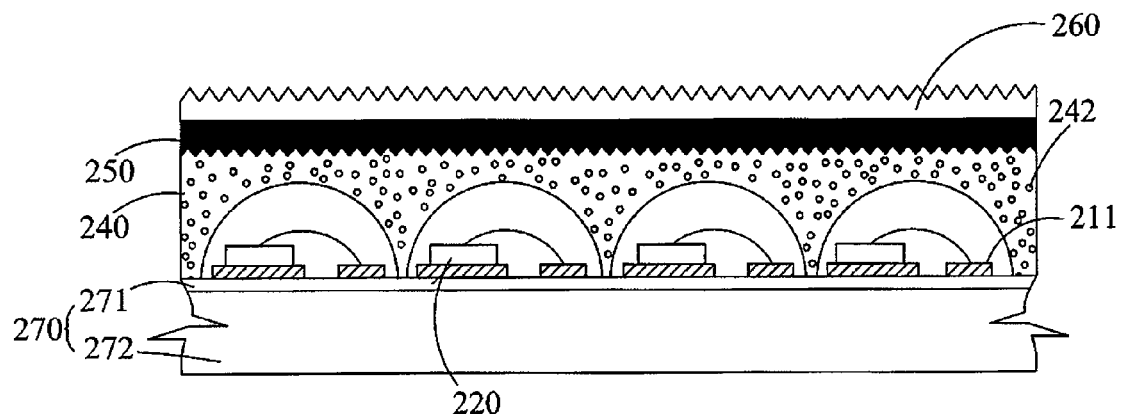
Figure 2K:
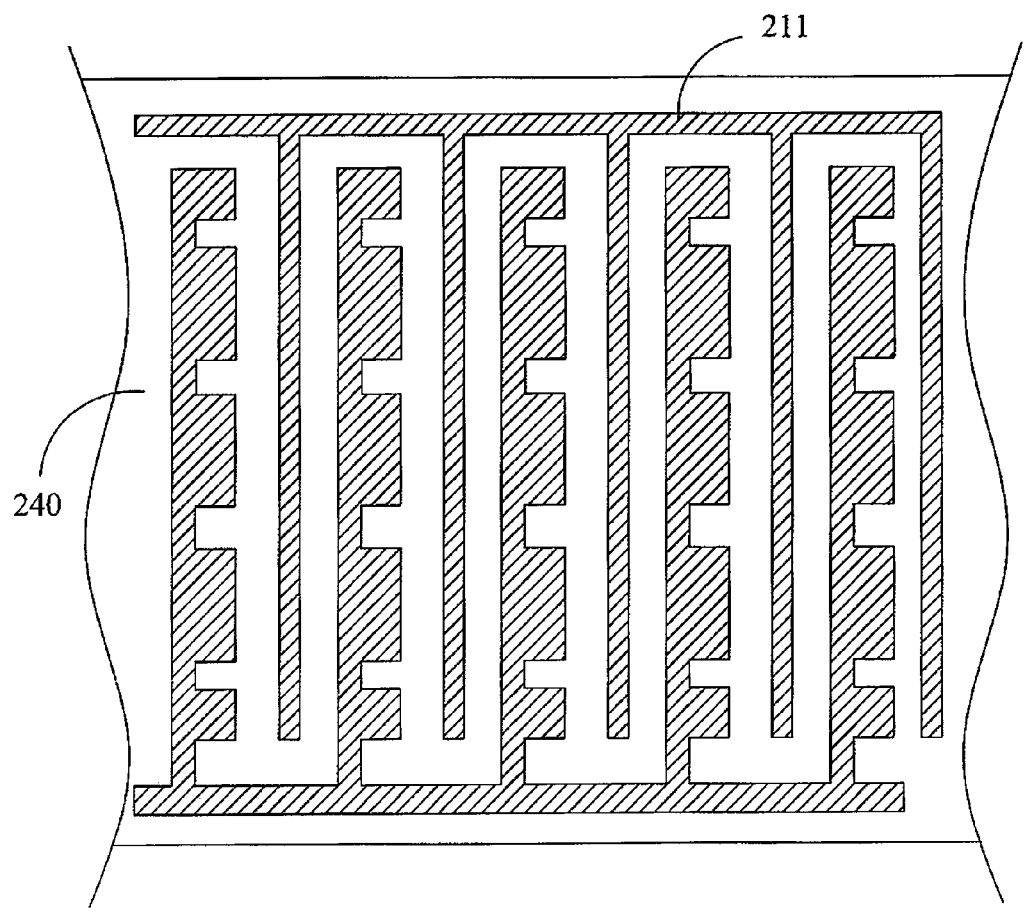
FIG. 2K illustrates a schematic bottom view of the structure of FIG. 2I.

FIG. 2K illustrates a schematic bottom view of the structure of FIG. 2I, in which the patterned conductive layer 211 is exposed. As shown in FIG. K, the exposed patterned conductive layer 211 occupies the major portion of the bottom surface of the light emitting apparatus to exhibit good thermal dissipation. FIG. 2J illustrates another embodiment for enhancing thermal dissipation by disposing a thermal dissipation device 270 such as a thermal dissipation paste 271 and/or a heat sink 272 under the exposed patterned conductive layer 211.

Figure 2L:
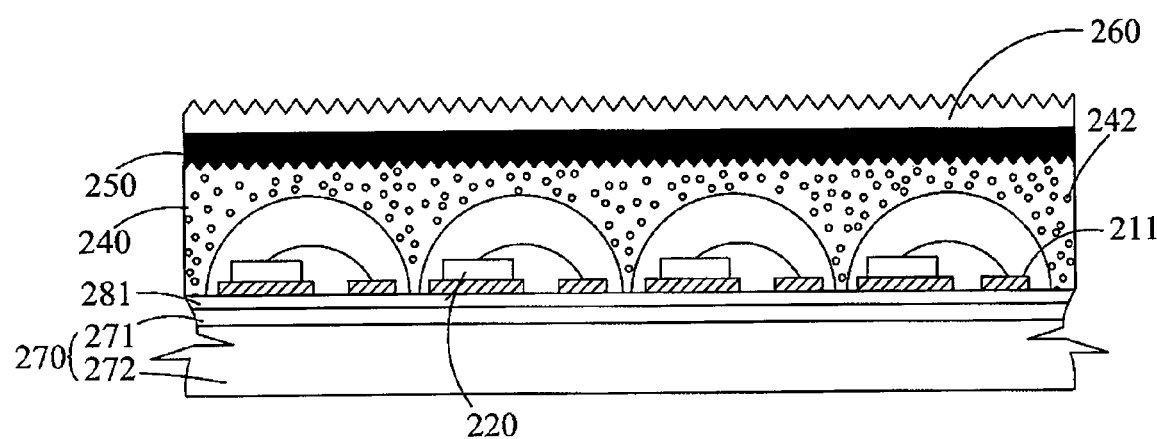
FIG. 2L illustrates a schematic section view of a light emitting apparatus having the structure of FIG. 2J and a reflective layer.

FIG. 2L illustrates another embodiment of the present invention, in which FIG. 2L further includes a reflective layer 281 interposing between the thermal dissipation device 270 and the patterned conductive layer 211. The reflective layer 281 can reflect light towards the bottom side to prevent light from dissipation or adsorption by thermal dissipation device 270 or other devices. The reflective layer 281 can be made of any suitable materials.

Figure 3A:
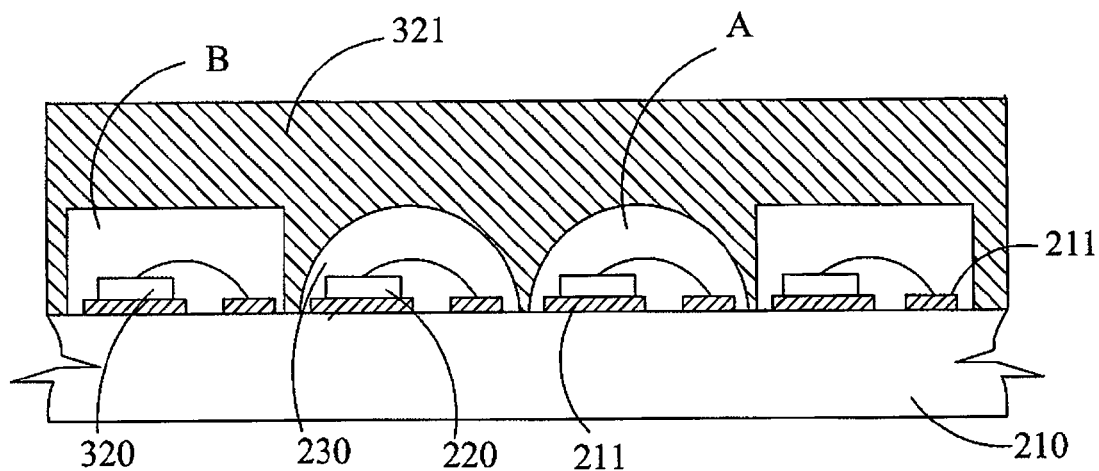
FIG. 3A to FIG. 3C illustrate schematic section views of a light emitting apparatus during manufacturing in accordance with a second embodiment of the present invention.
Figure 3B:
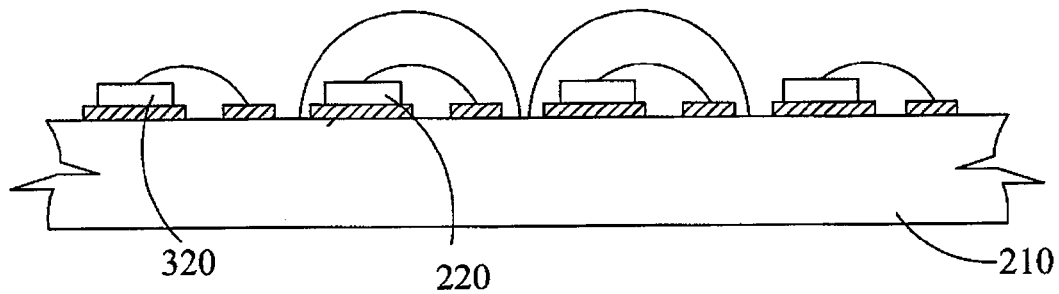
Figure 3C:
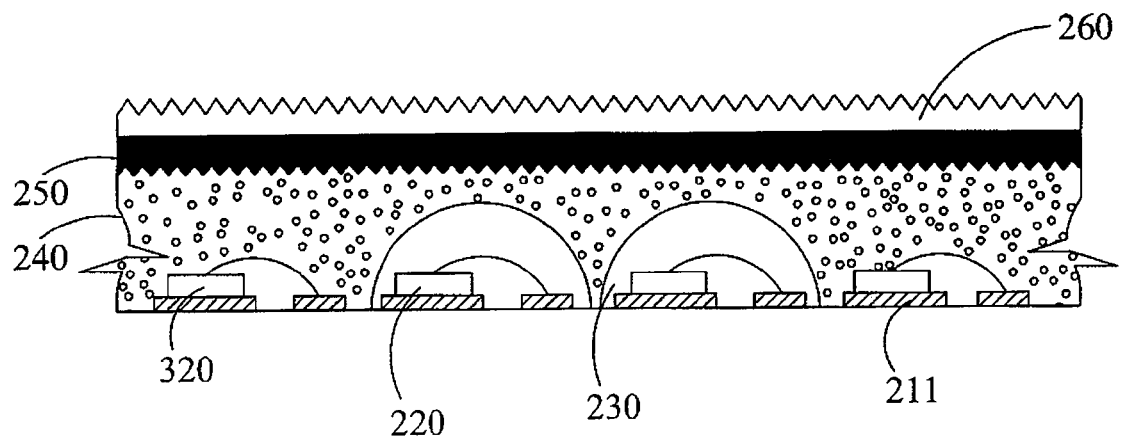

FIG. 3A and FIG. 3C illustrate a second embodiment of the present invention. The differences between the first embodiment and the second embodiment are described hereinafter.

The second embodiment further provides an electronic component 320 different from the light emitting component 220. The electronic component 320 can be a Zener diode for controlling the light emitting component 220. Note that the electronic component 320 is embedded in the first light diffusion layer 240. As to the procedures of the second embodiment, referring to FIG. 3A, the light emitting components 220 and the electronic component 320 are disposed under the fourth injection mold 321, wherein the cavity A for the light emitting components 220 is injected with molding materials to be the transparent layer 230 while the cavity B for the light emitting components 220 is not the same. After forming transparent layer 230, the fourth injection mold is removed and the light emitting components 220 are embedded in the transparent layer 230 while the electronic component 220 is exposed as shown in FIG. 3B. After forming the structure of FIG. 3B, another two injection molding procedures for the first light diffusion layer 240 and the prism layer 260, and the optional procedure for the second light diffusion layer 250 as aforementioned are performed to build an integrated light emitting apparatus as shown in FIG. 3C. Note that, the second embodiment can further include a reflective layer (not shown) attached to the bottom side of the structure of FIG. 3C.

Figure 4A:
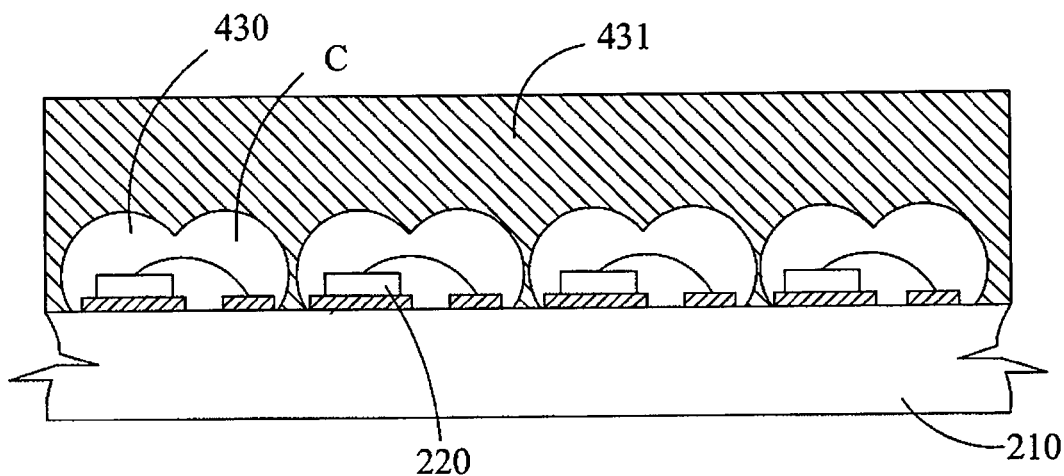
FIG. 4A to FIG. 4B illustrate schematic section views of a light emitting apparatus during manufacturing in accordance with a third embodiment of the present invention.
Figure 4B:
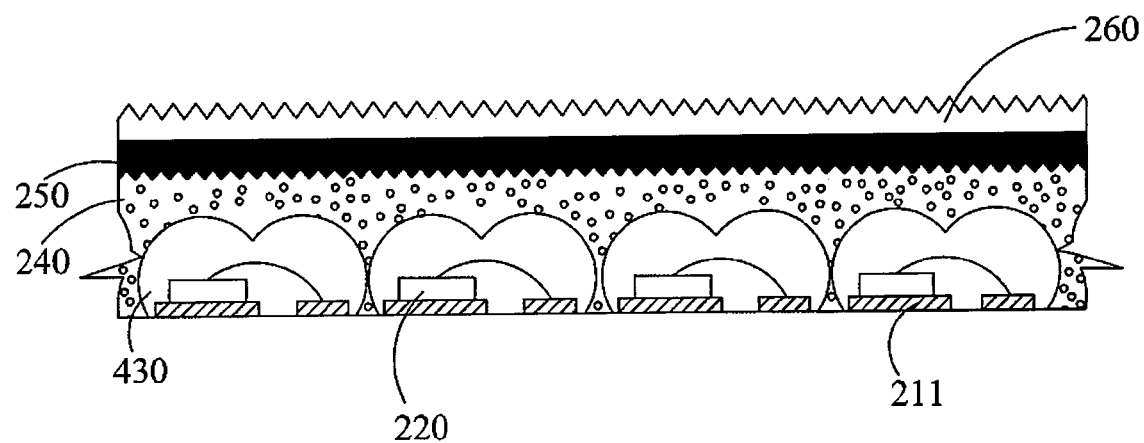

FIG. 4A and FIG. 4B illustrate a third embodiment of the present invention. The differences between the first embodiment and the third embodiment are described hereinafter.

The transparent layer 430 of the third embodiment differs from the first embodiment in that the surface defining each cavity C is waved. As to the procedures of the second embodiment, referring to FIG. 4A, a fifth injection mold 431 having multiple cavities C is provided, wherein each cavity C are defined by an uneven surface of the fifth injection mold 431. The substrate 210 with the light emitting components 220 are disposed under the fifth injection mold 431 to allow each cavity C to cover each light emitting component 220. Then, materials to be a transparent layer 430 are injected into the cavities C. After hardening the materials, the transparent layer 430 with waved outer surface is formed. The fifth injection mold is then removed. The waved transparent layer 430 has advantages in generating multiple light points when light from the light emitting components 220 passing there through. By way of the waved transparent layer 430, the potential shadows caused by the light emitting components 220 can be avoided and the illumination will be more uniform. After forming the structure of FIG. 4A, another two injection molding procedures for the first light diffusion layer 240, the prism layer 260, and the optional procedure for the second light diffusion layer 250 as aforementioned are performed to build an integrated light emitting apparatus as shown in FIG. 4B. Note that, the third embodiment can further include a reflective layer (not shown) attached to the bottom side of the structure of FIG. 4A.

The detailed description of the above preferable embodiment describes the technical features and spirit of the present invention, and the disclosed preferable embodiments are not intended to limit the scope of the present invention. On the contrary, the preferable embodiments and its variations or equivalents all fall within the scope of the present invention. Therefore, the scope of the present invention should be most broadly explained according to the foregoing description and includes all possible variations and equivalents.

I claim:

1. A method for manufacturing a light emitting apparatus, the method comprising the steps of:
   providing a substrate;
   forming a patterned conductive layer on the substrate;
   disposing a light emitting component on the patterned conductive substrate;
   forming a transparent layer by a first injection mold over the substrate and allowing the light emitting component to be embedded in the transparent layer;
   forming a first light diffusion layer by a second injection mold over the substrate and allowing the transparent layer to be embedded in the first light diffusion layer; and
   removing the substrate to expose the patterned conductive layer.

2. The method according to claim 1, further comprising forming a reflective layer on the exposed patterned conductive layer after removing the substrate.

3. The method according to claim 1, wherein the step of forming the transparent layer by the first injection mold over the substrate further comprises allowing the patterned conductive layer to be embedded in the transparent layer.

4. The method according to claim 1, wherein the transparent layer is arched by the first injection mold.

5. The method according to claim 1, wherein the transparent layer is waved by the first injection mold.

6. The method according to claim 1, further comprising making a surface of the first light diffusion layer rugged by plasma striking.

7. The method according to claim 1, further comprising making a surface of the first light diffusion layer rugged by the second injection mold.

8. The method according to claim 1, further comprising forming a prism layer on the first light diffusion layer by a third injection mold.

9. The method according to claim 8, further comprising forming a second light diffusion layer on the prism layer by evaporation.

10. The method according to claim 1, further comprising disposing an electronic component for controlling the light emitting component on the patterned conductive substrate at the step of forming the light emitting component on the patterned conductive substrate; and allowing the electronic component embedded in the first light diffusion layer at the step of forming the first light diffusion layer by the second injection mold over the substrate.

* * * * *